United States Patent
Myer

[11] Patent Number: 6,094,096
[45] Date of Patent: Jul. 25, 2000

[54] PILOT DETECTION FOR A CONTROL SYSTEM THAT REDUCES DISTORTION PRODUCED BY ELECTRICAL CIRCUITS

[75] Inventor: Robert Evan Myer, Denville, N.J.

[73] Assignee: Lucent Technologies Inc., Murray Hill, N.J.

[21] Appl. No.: 08/989,529

[22] Filed: Dec. 12, 1997

[51] Int. Cl.[7] ............................................. H03F 1/32
[52] U.S. Cl. ................................. 330/52; 330/151
[58] Field of Search ........................... 330/52, 151, 149; 375/296, 297

[56] References Cited

U.S. PATENT DOCUMENTS

| | | | |
|---|---|---|---|
| 5,323,119 | 6/1994 | Powell et al. | 330/151 |
| 5,386,198 | 1/1995 | Ripstrand et al. | 330/52 |
| 5,455,537 | 10/1995 | Larkins et al. | 330/52 |
| 5,576,659 | 11/1996 | Kenington et al. | 330/52 |
| 5,610,554 | 3/1997 | Anvari | 330/52 |
| 5,644,268 | 7/1997 | Hang | 330/151 |
| 5,808,512 | 9/1998 | Efraim et al. | 330/151 |
| 5,874,856 | 2/1999 | Van Horn | 330/151 |

FOREIGN PATENT DOCUMENTS

| | | | |
|---|---|---|---|
| 0 630 101 A2 | 11/1990 | United Kingdom | H03F 1/32 |
| 0 803 974 A1 | 4/1997 | United Kingdom | H03F 1/32 |

Primary Examiner—Robert Pascal
Assistant Examiner—Khanh Van Nguyen
Attorney, Agent, or Firm—Claude R. Narcisse

[57] ABSTRACT

The present invention provides an improved pilot detection technique for a control system comprising an electrical circuit that produces distortion and which applies the pilot signal to the electrical circuit and uses information obtained from the pilot signal to cancel the distortion from the electrical circuit.

15 Claims, 3 Drawing Sheets

PILOT DETECTION FOR A CONTROL SYSTEM THAT REDUCES DISTORTION PRODUCED BY ELECTRICAL CIRCUITS

BACKGROUND OF THE INVENTION

1. Field of the Invention

The present invention is directed to a control system for reducing distortion produced by electrical circuits and in particular to a control system that uses an improved pilot detection technique.

2. Description of the Related Art

Electrical circuits in general often add undesired distortion to an input signal, creating an output signal comprising distortion components and the input signal component. The distortion includes any undesired signals added to or affecting adversely the input signal. There is therefore a need to devise techniques that can eliminate substantially or reduce significantly the distortion produced by electrical circuits. A well known technique uses a control system and a pilot signal. The pilot signal is an electrical signal comprising at least one frequency component spectrally located near the frequency band of operation of the electrical circuit. A more complete description of the pilot signal is shown in FIG. 1.

Referring to FIG. 1, the frequency response of the electrical circuit is shown including the location of the pilot signal. The pilot signal can be near the lower edge of the operating band (e.g., pilot 1) or located near the upper edge of the band of operation (e.g., pilot 2). The pilot is positioned a spectral distance of $\Delta f$ from an edge of the band of operation whose center frequency is $f_0$. The pilot signal can also be located somewhere within the band of operation of the electrical circuit. It is readily obvious that the electrical characteristics (e.g., amplitude, phase response, spectral content) of the pilot signal are known. It should be noted that although the pilot signal is shown as a single spectral component of a certain amplitude, the pilot signal can comprise a plurality of spectral components having various amplitudes.

The control system reduces distortion produced by the electrical circuit by applying the pilot signal to the electrical circuit and making adjustments based on information obtained from the applied pilot signal. FIG. 2 discloses the control system and its use of information obtained from the pilot signal to reduce distortion produced by electrical circuit 108. Electrical circuit 108 can be any electrical circuit having at least one input and one output. Say, for example electrical circuit 108 can be a Radio Frequency (RF) linear amplifier, or a power amplifier.

Still referring to FIG. 2, an input signal is applied to splitter 102. Splitter 102 replicates the input signal on paths 128 and 130. Splitter 102 is part of a feed forward loop referred to as loop # 1, which in addition to splitter 102, comprises Gain & Phase circuit 104, coupler 132, electrical circuit 108, delay circuit 106 and coupler 116. The input signal on path 130 is applied to Gain & Phase circuit 104. The output of Gain & Phase circuit 104 and the pilot signal are applied to coupler 132. Typically, the amplitude of the pilot signal is much less (e.g., 30 dB less) than the amplitude of the input signal so as not to interfere with the operation of electrical circuit 108. The output of coupler 132 is applied to electrical circuit 108 whose output comprises the input signal, the pilot signal and distortion signals produced by electrical circuit 108. A portion of the output of electrical circuit 108 is obtained from coupler 114 and is combined with a delayed version of the input signal (signal on path 127) at coupler 116 via connecting path 115. The signal on path 127 has experienced sufficient delay provided by delay circuit 106 so that such signal experiences the same delay as the input signal appearing at coupler 116 via path 115.

Gain & Phase circuit 104 is controlled via control path 134 with at least one control signal to adjust the gain and phase of the input signal such that the input signal appearing at coupler 116 via path 115 is substantially the inverse (equal in amplitude but 180° out of phase) of the delayed input signal at coupler 116 via path 127. The control signal appearing on control path 134 of Gain & Phase circuit 104 is derived from the signal at point A in a well known manner such as the use of detection circuits. The detection circuits detect well known electrical signal characteristics such as amplitude, phase, and frequency of the signal. Therefore, the input signals applied to coupler 116 substantially cancel each other leaving at point A the pilot signal and distortion signals produced by electrical circuit 108. Loop # 1 is thus a feed forward loop which serves to isolate at point A the pilot signal and distortion signals produced by electrical circuit 108.

The signals appearing at point A (pilot signal and distortion signals) are fed to Gain & Phase circuit 110 whose output is fed to amplifier 112 whose output is applied to coupler 120 via path 126. A portion of the output signals (input signal, pilot signal and distortion signals) of electrical circuit 108 is fed to delay circuit 118 whose output is fed to coupler 120 via path 124. Delay circuit 118 is designed such that signals from the output of electrical circuit 108 applied to coupler 120 via path 124 experience substantially the same delay as the signals from the output of electrical circuit 108 applied to coupler 120 via path 126.

Because the frequency, amplitude and other electrical characteristics of the pilot signal are known, pilot detect circuit 140 can use circuits such as a mixer connected to a log detector (or other well known detection circuits) to detect the pilot signal or a portion of the pilot signal via coupler 138. The pilot signal is used to obtain information about the distortion produced by electrical circuit 108. The information is obtained by detecting well known electrical signal characteristics of the pilot signal. In particular, the characteristics (e.g., amplitude, spectral content, phase response) of the pilot signal are known and thus when pilot detect circuit 140 detects the pilot signal, some or all of the known characteristics may have been altered due to the distortion effects of electrical circuit 108. Detection circuit 140 will detect such distortion effects and use this information to generate control signals onto path 136 to cause Gain & Phase circuit 110 to modify the pilot signal at point A such that the pilot signal at coupler 120 via path 126 is substantially the inverse (equal in amplitude but 180° out of phase) of the pilot signal at coupler 120 via path 126. The corresponding pilot signals and the distortion signals at coupler 120 cancel substantially each other at coupler 120 leaving the input signal (or an amplified version of the input signal) at the output of the control system. Therefore, loop # 2, which comprises coupler 114, coupler 116, Gain & Phase circuit 136, amplifier 112, coupler 120 and delay circuit 118 is a feed forward loop which uses the information obtained from the pilot signal to cancel substantially the distortion produced by electrical circuit 108.

In an actual circuit, there is rarely an absolute cancellation of the distortion and the pilot signals. Thus, the output signal of the control system of FIG. 2 still contains some relatively minute amount of distortion. The residual distortion, which exists in the feed forward loop (loop #2), is also a result of dynamic distortion characteristics exhibited by many electrical circuits such as electrical circuit 108. Amplifier 112 also adds distortion to the output signal. It is therefore desirable to detect the pilot signal and obtain information from the pilot signal to cancel the residual distortion.

The output of the control system contains the pilot signal, albeit very small in amplitude compared to the output signal, that can be used to cancel the residual distortion from the feed forward loop (loop # 2). The amplitude of the pilot signal is typically relatively small compared to the output signal because of the cancellation effects of the feed forward loop #2 as described above and the relative amplitude (also described above) of the pilot signal with respect to the amplitude of the input signal at the input of electrical circuit 108. Thus, it becomes very difficult to detect the pilot signal at the output of the control system.

One way of detecting the pilot signal is to use a filter with a very sharp and narrow spectral bandwidth. The use of a filter to detect the pilot signal is a very constricting design in that any change or deviation in the frequency and/or amplitude of the pilot signal would require the design of another filter. Different filters have to be used with different pilot signals making the design and use of a control system with such a pilot detect design limiting and somewhat impractical. Also, the requirement to use different filters based on the selected pilot signal tends to complicate the design of the control system and increase the cost of such a system.

Therefore, in order to improve the distortion cancellation effects of the control system of FIG. 2, there exists a need to have a flexible design for detecting the pilot signal without significantly adding to the complexity and cost of the control system.

SUMMARY OF THE INVENTION

The present invention provides an improved pilot detection technique for a control system having an input, an output and comprising an electrical circuit that produces distortion where a pilot signal is applied to the electrical circuit and said pilot signal provides information that is used by the control system to substantially cancel the distortion. The control system comprises a feed forward loop coupled to the control system for detecting the pilot signal at the output of the control system where the control system obtains information from the pilot signal that the control system uses to substantially cancel any residual distortion.

DETAILED DESCRIPTION

Figure 1:
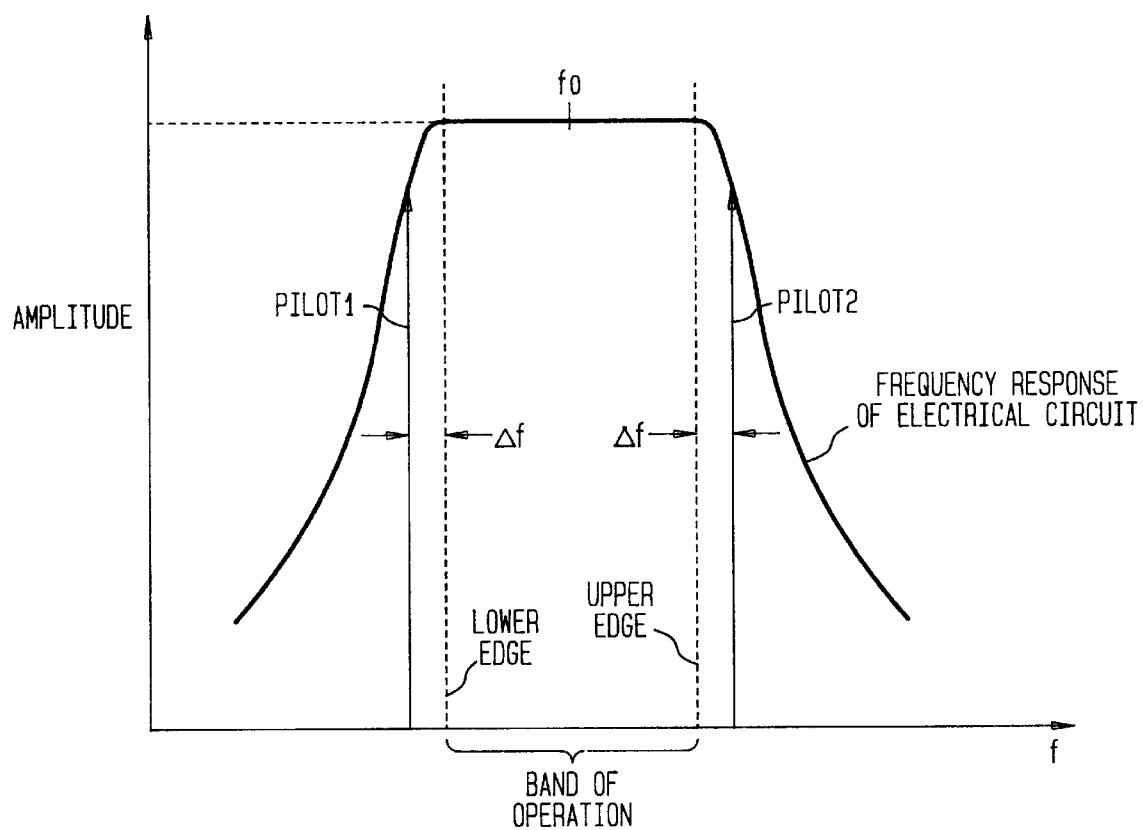
FIG. 1 is a frequency response curve of an electrical circuit showing the frequency within which the electrical circuit is operating.
Figure 2:
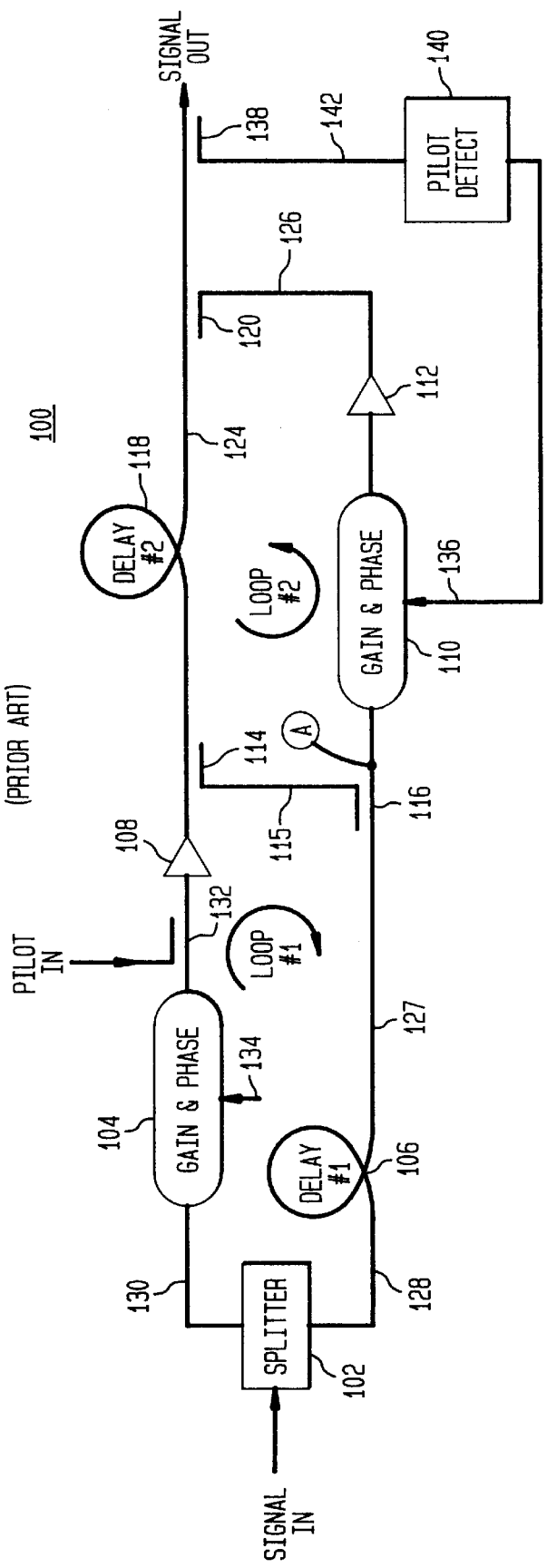
FIG. 2 is a block diagram of a prior art control system using a feed back loop and a feed forward loop.
Figure 3:
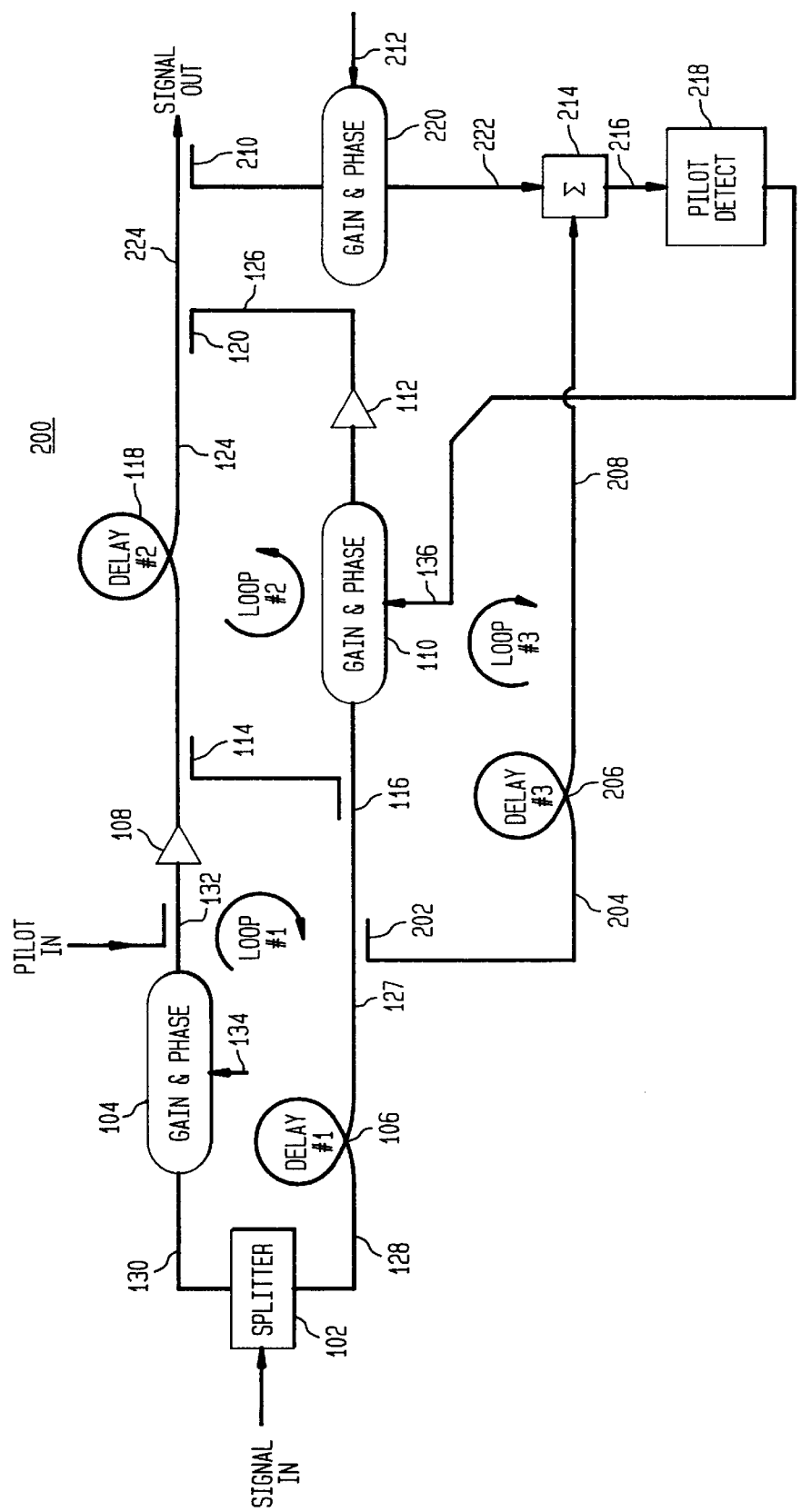
FIG. 3 is a block diagram of the present invention.

Referring now to FIG. 3 in which like reference numerals identify similar or identical elements, FIG. 3 depicts the present invention in which a feed forward loop (loop #3) is coupled to a control system (200) having an input, an output and comprising an electrical circuit that produces distortion where said control system applies a pilot signal to the electrical circuit and obtains information from the pilot signal to reduce distortion produced by the electrical circuit. The electrical circuit can be any circuit that has at least one input and one output. The feed forward loop (loop #3) detects the pilot signal at the output of the control system where said detected pilot signal provides information that is used by the control system to substantially cancel out any residual distortion at the output of the control system.

Still referring to FIG. 3, control system 200 has a three loop configuration in which a pilot signal is applied to electrical circuit 108 to which a first feed forward loop (loop #1) and a second feed forward loop (loop # 2) are coupled. When an input signal is applied to splitter 102 and a pilot signal is applied to electrical circuit 108 as shown, the output of the control system (signal path 224) comprises the input signal and a substantially attenuated pilot signal. The input signal appearing at the output of the control system contains distortion not totally canceled by loop # 2 of the control system. The present invention uses a third feed forward loop to detect the substantially attenuated pilot signal where said detected pilot signal provides information about any residual distortion and said information is used by the control system to substantially cancel the residual distortion. The information is obtained through the use of well known detection circuitry. The information can be for example amplitude, phase, frequency alterations suffered by the pilot signal which are detected by the well known detection circuitry.

The third feed forward loop, labeled as loop #3, comprises coupler 202, coupler 116, Gain & Phase circuit 110, amplifier 112, coupler 120, coupler 210, Gain & Phase circuit 220, summer 214 and delay circuit 206. A portion of the output signal of the control system is obtained via coupler 210 and applied to Gain & Phase circuit 220 whose output is applied to an input of summer 214 via path 222. A portion of the delayed input signal on path 127 is obtained via coupler 202 and applied to delay circuit #3 (206) whose output is applied to another input of summer 214 via path 208. Delay circuit # 3 is configured such that the delay experienced by the input signal on path 208 is made substantially equal to the delay experienced by the input signal on path 222. In particular, the delay of the input signal through splitter 102, Gain & Phase circuit 104, coupler 132, electrical circuit 108, coupler 114, delay circuit 118, coupler 120, coupler 210 and Gain & Phase circuit 220 is made substantially equal to the input signal delay through splitter 102, delay #1 (106), coupler 202, and delay #3 (206).

The output of summer 214 which appears on path 216 is the algebraic sum of the signals appearing on paths 208 and 222. The output of summer 214 is detected through well known circuits (e.g., power detectors, phase detectors; not shown) and converted, through well known means, to at least one control signal applied to control path 212 of Gain & Phase circuit 220. The control signals appearing on control path 212 cause Gain & Phase circuit 220 to modify the input signal on path 224 so that it is substantially the inverse (equal in amplitude but 180° out of phase) of the input signal on path 208. When the two input signals are added with the use of summer 214, they substantially cancel each other.

In short, the input signal and the pilot signal appearing at the output of the control system (path 224) are added to a delayed input signal (on path 208) via summer 214 such that the input signals substantially cancel each other leaving the pilot signal and a substantially reduced input signal on signal path 216. The resulting pilot signal on path 216 is detected through well known by detection circuitry 218. For example, detection circuitry 218 can comprise a mixer connected to a log detector. The detected pilot signal is converted to at least one control signal in a well known manner which is applied to control path 136 of Gain & Phase circuit 110 whose output is applied to coupler 120 via amplifier 112 so as to cancel any residual distortion produced by electrical circuit 108. The detected pilot provides information about the residual distortion and such information is used by pilot detect circuit 218 to make the proper adjustments through Gain & Phase circuit 110 so as to substantially cancel the residual distortion.

The various circuits used in loops #1, 2 and 3 of the control of the present invention are well known to those of ordinary skill in the art to which this invention belongs. Splitters such as splitter 102 are typically passive devices with one input and at least two outputs where the output signals are equal divisions or portions of an applied input signal. Delay circuits such as delay circuits 106, 206 and 118 are circuits that delay an input signal by a particular time period. Summer 214 is a circuit having at least two inputs and one output and algebraically adds the amplitude and phase or power of its input signals.

Gain & Phase circuits 104, 136 and 220 are circuits which can modify the amplitude and phase of signals applied to their input based on the values of their control signals. Couplers 132, 202, 114, 120 and 210 are circuits which can combine two or more signals and provide access to a portion of the combined signal. The detection circuits although not shown are well known circuits such as log detectors, null circuits, and mixers. Log detectors are typically implemented as circuits that calculate the average amplitude of a signal applied to their input. Null circuits are typically implemented as circuits that can sense an input signal and generate control signals based on the sensed input signal where the control signals can be stored for future use. Other well known circuits which perform the above described functions can be used to implement the present invention. Furthermore, the circuits or their equivalents used in the present invention can be implemented with electrical, electronic (digital and analog), optical and electromechanical devices.

I claim:

1. A control system having an input, an output and comprising an electrical circuit that produces distortion where a pilot signal is applied to the electrical circuit and said pilot signal provides information that is used by the control system to substantially cancel the distortion, the control system further comprising:
    a feed forward loop coupled to the control system, the feed forward loop comprising a summer that detects the pilot signal by forming an algebraic sum of signals at the input and output of the control system and further comprising detection circuitry that convert the sum to at least one control signal used to substantially cancel any residual distortion.

2. The control system of claim 1 where the input signal is delayed by a delay circuit.

3. The control system of claim 1 where the information is obtained from the detected pilot signal with detection circuitry to cancel substantially the residual distortion.

4. The control system of claim 1 where the feed forward loop further comprises a Gain & Phase circuit that modifies the output signal so that it is substantially the inverse of a delayed input signal.

5. A control system having an input, an output and comprising an electrical circuit that produces distortion where a pilot signal applied to the electrical circuit provides information that the control system uses to cancel substantially the distortion, the control system further comprising:
    a feed forward loop, said feed forward loop comprising a Gain & Phase circuit coupled to the output of the control system, a summer coupled to the Gain & Phase circuit which modifies the output so that when the summer adds an output signal to an input signal the pilot signal is detected and converted to at least one control signal applied to the control system for canceling substantially any residual distortion.

6. The control system of claim 5 where the summer detects the pilot signal by adding algebraically the output of the control system to a delayed input signal to the control system.

7. The control of claim 5 where the Gain & Phase circuit modifies the output of the control system such that the pilot signal at one input of the electrical circuit is substantially the inverse of the pilot signal appearing at an input of the summer.

8. The control system of claim 5 where the summer has an output which is detected and converted to at least one control signal applied to the Gain & Phase circuit causing the Gain & Phase circuit to modify the output of the control system.

9. The control system of claim 5 where the output of the summer is applied to a pilot detect circuit which converts the output of the summer to at least one control signal applied to a Gain & Phase circuit of the control system to substantially cancel any residual distortion.

10. A control system having an electrical circuit that produces distortion to which a pilot signal is applied, the control system comprising:
    a first feed forward loop coupled to the electrical circuit for isolating the pilot signal and the distortion;
    a second feed forward loop coupled to the first feed forward loop for obtaining information from the isolated pilot signal and using the information to cancel substantially the distortion; and
    a third feed forward loop coupled to the first and second feed forward loops, the third feed forward loop comprising a summer which detects the pilot signal by forming an algebraic sum of the signals at the input and output of the control system and the sum is converted to a control signal used to cancel substantially any residual distortion.

11. The control system of claim 10 where the third feed forward loop has a Gain & Phase circuit coupled to the second feed forward loop where said Gain & Phase circuit modifies signals from the second feed forward loop in accordance with control signals generated from the output of the summer.

12. The control system of claim 10 where the detected pilot signal is converted to at least one control signal by a pilot detect circuit coupled to the summer and where the at least one control signal is applied to the second feed forward loop for canceling substantially any residual distortion.

13. A method for detecting a pilot signal applied to an electrical circuit that produces distortion where the electrical circuit is coupled to a control system having an input and an output where the control system obtains information from the pilot signal to cancel substantially the distortion, the method comprising the steps of:
    applying an input signal to the input of the control system;
    forming an algebraic sum of the signals at the output and input of the control system with a summer thus detecting the pilot signal; and
    converting the sum to at least one control signal that is used to substantially cancel any residual distortion.

14. The method of claim 13 where the step of forming an algebraic sum further comprises the step of:
    modifying the signal at the output of the control system with a Gain & Phase circuit coupled to the output of the control system so that the input and output signals substantially cancel each other.

15. The method of claim 13 where the step of converting the sum comprises the step of:
    applying the sum to detection circuitry coupled to the summer.

* * * * *